United States Patent [19]
Adachi et al.

[11] Patent Number: 5,694,089
[45] Date of Patent: Dec. 2, 1997

[54] FAST FREQUENCY SWITCHING SYNTHESIZER

[75] Inventors: Hisashi Adachi, Mino; Hiroaki Kosugi; Tomoki Uwano, both of Hirakata, all of Japan

[73] Assignee: Matsushita Electric Industrial Co, Ltd., Osaka, Japan

[21] Appl. No.: 600,683

[22] Filed: Feb. 13, 1996

[30] Foreign Application Priority Data

Feb. 14, 1995 [JP] Japan ............................. HEI7-025026

[51] Int. Cl.⁶ ............................................. H03L 7/18
[52] U.S. Cl. ..................... 331/16; 331/25; 327/105; 327/113; 327/147; 327/156
[58] Field of Search ..................... 377/48; 331/25, 331/16; 327/105, 107, 113, 155, 158, 156, 159, 147

[56] References Cited

U.S. PATENT DOCUMENTS

| | | |
|---|---|---|
| 5,038,117 | 8/1991 | Miller ........................................ 331/16 |
| 5,267,273 | 11/1993 | Dartois et al. ............................ 375/106 |
| 5,420,545 | 5/1995 | Davis et al. ............................... 331/17 |
| 5,424,687 | 6/1995 | Fukuda ...................................... 331/11 |

FOREIGN PATENT DOCUMENTS

| | | |
|---|---|---|
| 434 527 | 6/1991 | European Pat. Off. . |
| 444 237 | 9/1991 | European Pat. Off. . |
| 61-131914 | 6/1986 | Japan . |

OTHER PUBLICATIONS

E. Sharoni, "Fast Switching Synthesizer", Conference Record of the 1985 IEEE Military Communications Conference, vol. 2 of 3, pp. 329–333, Oct. 20–23, 1985.
European Search Report dated Dec. 20, 1996.

*Primary Examiner*—Robert Pascal
*Assistant Examiner*—An T. Luu
*Attorney, Agent, or Firm*—Ratner & Prestia

[57] ABSTRACT

This is a PLL frequency synthesizer having a reference divider for dividing a reference source signal, and an RF divider for dividing the output of a voltage controlled oscillator, wherein when changing over the frequency, first the division value of the RF divider changes periodically to become a fractional division value in average, and after the frequency is nearly changed over, the RF divider is set in a conventional integer division operation, therefore, the frequency can be changed over at high speed by the fractional division operation high in reference frequency, and after the changing, a low spurious signal characteristic may be realized.

16 Claims, 11 Drawing Sheets

Fig. 7
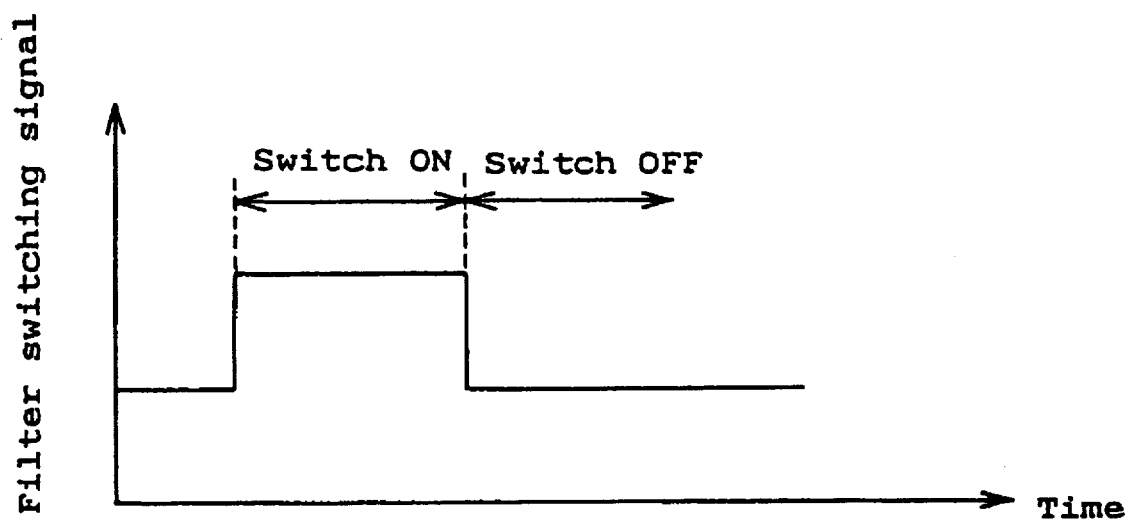
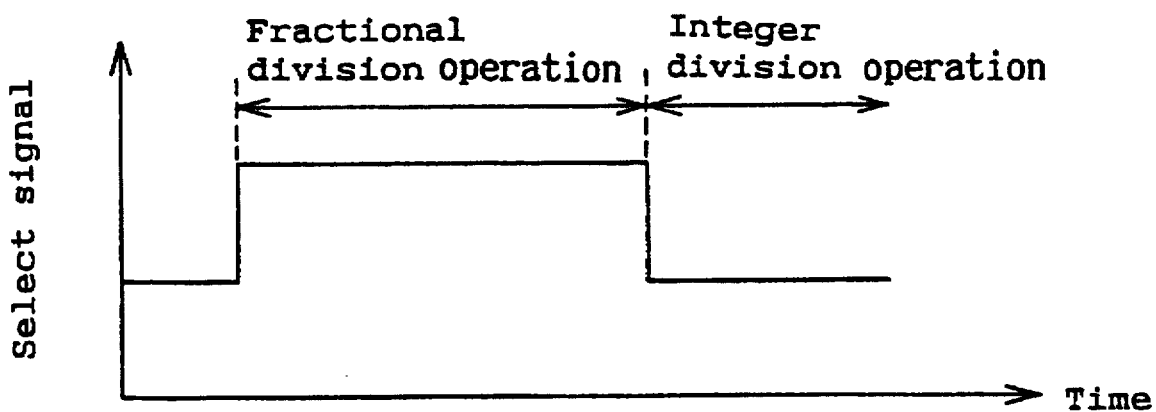

5,694,089

FAST FREQUENCY SWITCHING SYNTHESIZER

BACKGROUND OF THE INVENTION

1. Field of the Invention

The present invention relates to a frequency synthesizer which operates by heightening the frequency of reference signal higher than the output frequency interval that can be set, in order to change over the output signal frequency at high speed.

2. Description of the Related Art

As a system of frequency synthesizer capable of changing over the output signal frequency at high speed, a fractional-N synthesizer has been known hitherto. The fractional-N synthesizer is a method of changing the division value of the RF divider in time, realizing the division value at a precision of below the decimal point as the average value, and heightening the reference frequency higher than the output signal frequency interval, and since the reference frequency is high, the output signal frequency can be changed over at high speed.

FIG. 11 shows a structural diagram of frequency synthesizer of the conventional fractional-N system. In FIG. 11, reference numeral 901 is a VCO (voltage controlled oscillator), 902 is an RF divider, 903 is a reference divider, 904 is a phase/frequency comparator, 905 is a loop filter, 906 is an RF divider controller, and 907 is a reference divider controller.

The RF divider 902 divides and outputs the output signal frequency of the VCO 901 according to the value set in the RF divider controller. The reference divider 903 divides and outputs the reference signal according to the value set in the reference divider controller 907. The phase/frequency comparator 904 compares the phase between the output signal of the RF divider 902 and the output signal of the reference divider 903, and outputs a phase error. The output of the phase/frequency comparator 904 is put into the VCO 901 through the loop filter 905, and the output signal frequency is controlled so that the output signal of the VCO 901 may be phase-locked in the output signal of the reference divider 903. The output of the VCO 901 is delivered outside as output signal, and is also fed into the RF divider 902.

The RF divider controller 906 outputs an integer value which changes periodically so that the average of the output values to the RF divider 902 may be a fractional value, and the reference divider controller 907 outputs a specific integer value to the reference divider 903. The output signal frequency of the VCO 901 is the product of the phase comparison frequency of the phase/frequency comparator 904 multiplied by the average of the division value of the RF divider 902.

In such conventional constitution, however, since the division value of the RF divider 902 changes periodically, the output signal of the phase/frequency comparator 904 changes periodically the control voltage of the VCO 901 through the loop filter 905. Accordingly, the frequency component in the period of this change appears as a spurious signal in the output signal of the VCO 901. This spurious signal is generally very high in level, and it is extremely difficult to suppress it.

SUMMARY OF THE INVENTION

It is hence an object of the invention to present a frequency synthesizer capable of changing fast the output signal frequency, and decreasing the spurious signal of output signal.

To achieve the object, the invention presents a fast frequency switching synthesizer comprising a reference divider for dividing a reference source signal, a VCO (voltage controlled oscillator), an RF divider for dividing the output signal of the VCO, a phase/frequency comparator for comparing the phases of the output signal of the RF divider and the output signal of the reference divider, a loop filter for receiving a detected phase error and issuing a control voltage of the VCO, and a division value controller for changing the division value of the RF divider to obtain a fractional value as the average of the value obtained by changing periodically the value of the integer when changing the output signal frequency of the VCO, for changing the division value of the RF divider to obtain an integer value not changing after change of the output signal frequency is substantially completed, and determining the division value of the reference divider as the division value corresponding to the integer value.

When the division value of the RF divider is a fractional value, the output frequency of the VCO can be switched fast by heightening the reference frequency which is the output of the reference and widening the loop bandwidth. After the output frequency is changed, it operates as an ordinary frequency synthesizer not changing in the division value, so that the spurious signal can be suppressed.

BRIEF DESCRIPTION OF THE DRAWINGS

FIG. 7 is a timing chart of filter switching signal and select signal of the frequency synthesizer in the third embodiment;

DESCRIPTION OF THE PREFERRED EMBODIMENTS

Figure 1:
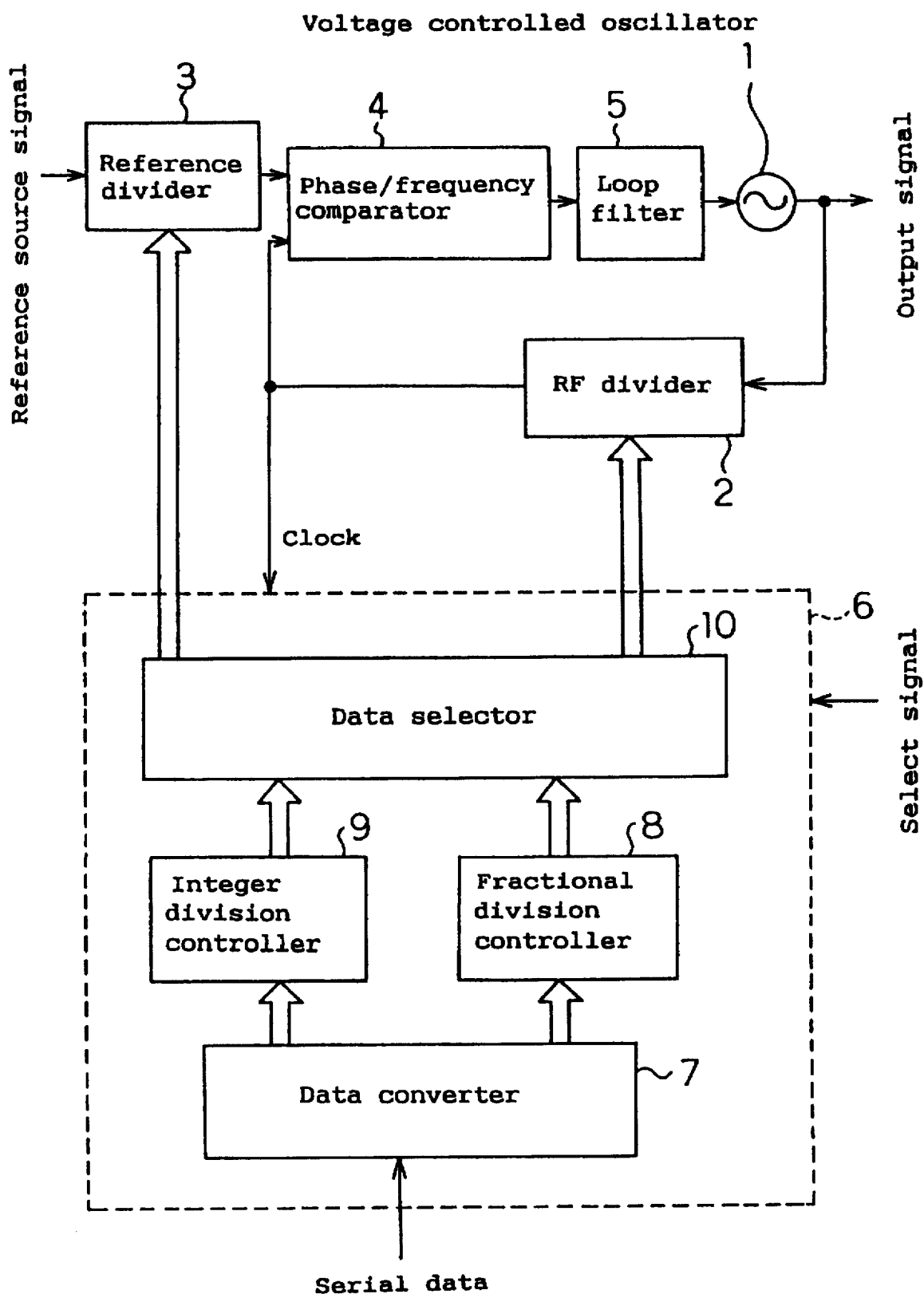
FIG. 1 is a structural diagram of a frequency synthesizer in a first embodiment of the invention.

FIG. 1 is a structural diagram of a frequency synthesizer according to the invention. In FIG. 1, reference numeral 1 is a VCO (voltage controlled oscillator), 2 is an RF divider, 3 is a reference divider, 4 is a phase/frequency comparator, 5 is a loop filter, and 6 is a division value control circuit.

The RF divider 2 divides and outputs the output signal frequency of the VCO 1 according to the value set in the division value control circuit 6. The reference divider 3 divides and outputs the reference signal according to the value set in the division value control circuit 6. The phase/frequency comparator 4 compares the phases of the output signal of the RF divider 2 and output signal of the reference divider 3, and outputs a phase error. The output of the phase/frequency comparator 4 is fed into the VCO 1 through the loop filter 5, and controls the output signal frequency so that the output signal of the VCO 1 may be phase-locked in the output signal of the reference divider 3. The output of the VCO 1 is issued outside as output signal, and is also fed into the RF divider 2.

The division value control circuit 6 comprises a data converter 7, a fractional division controller 8, an integer division controller 9, and a data selector 10. The serial data entering from outside is fed into the fractional division controller 8 and integer division controller 9 through the data converter 7, and either output of the fractional division controller 8 or the integer division controller 9 is selected by the data selector 10 depending on the select signal, and the division values of the RF divider 2 and reference divider 3 are controlled.

In this specification, a fractional division means that the division value (which means a value utilized for frequency dividing operation) of the frequency divider for the output signal frequency of the voltage controlled oscillator is variable, and a integer division means that the division value of the frequency divider for the output signal frequency of the voltage controlled oscillator is fixed.

Figure 2:
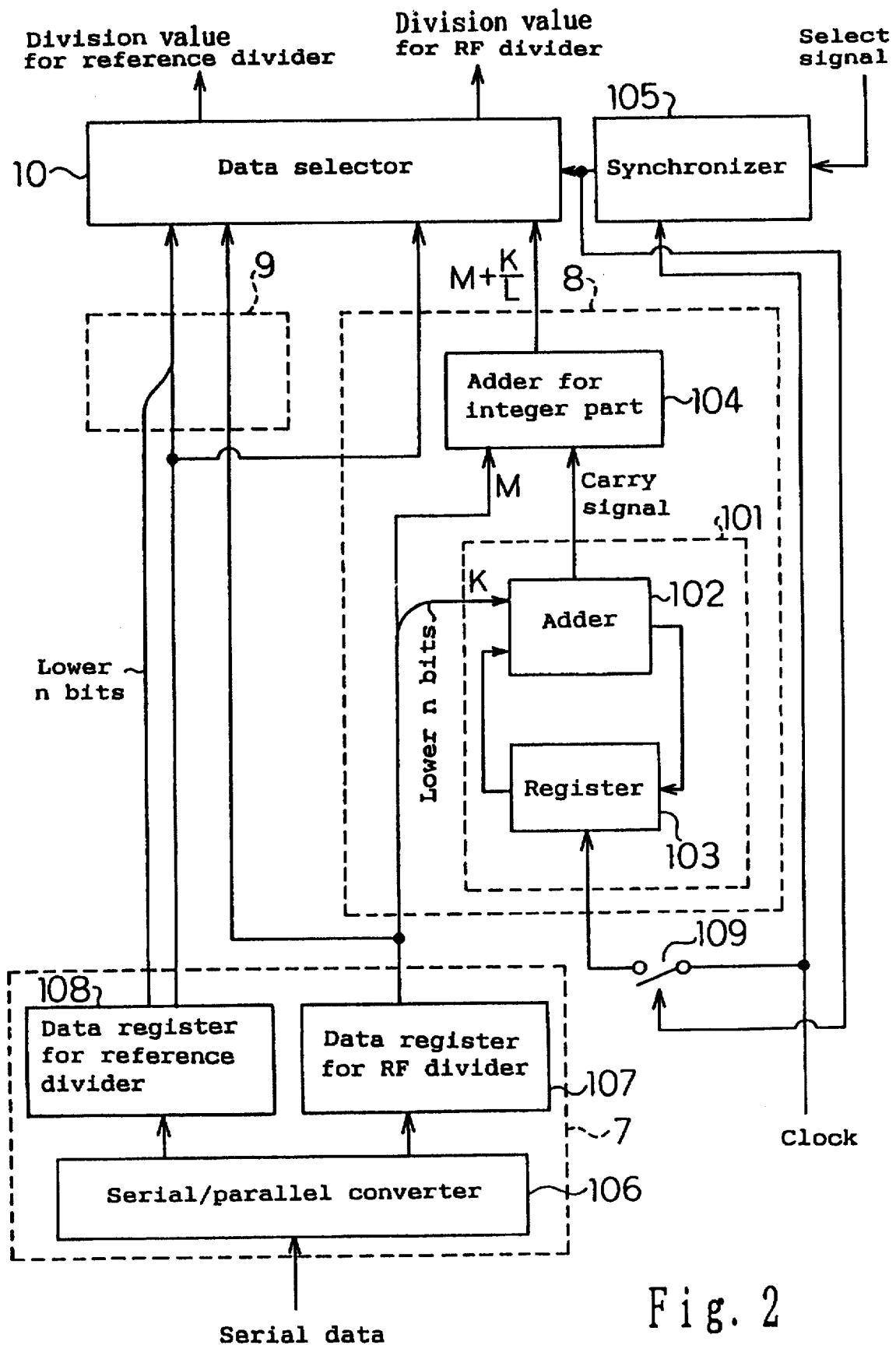
FIG. 2 is a structural diagram of a division value control circuit of the frequency synthesizer in the first embodiment.

A detailed structure of the division value control circuit 6 is shown in FIG. 2. In FIG. 2, reference numeral 101 is an accumulator, 102 is an adder, 103 is a register, 104 is an integer part adder, 105 is a synchronizer, 106 is a serial-parallel converter, 107 is a data register for RF divider, 108 is a data register for reference divider, and 109 is a switch.

The serial-parallel converter 106 converts the serial data entering from outside into parallel data, and stores in the data register for RF divider 107 and data register for reference divider 108. The integer division controller 9 outputs the values of the data register for RF divider 107 and data register for reference divider 108 directly into the data selector 10. The fractional division controller 8 outputs the upper bits excluding lower bits of the data register for reference divider 108 into the data selector 10. Of the data entering from the data register for RF divider 107 into the fractional division controller 8, lower n bits enter the accumulator 101 and upper bits enter the integer part adder 104.

Figure 3:
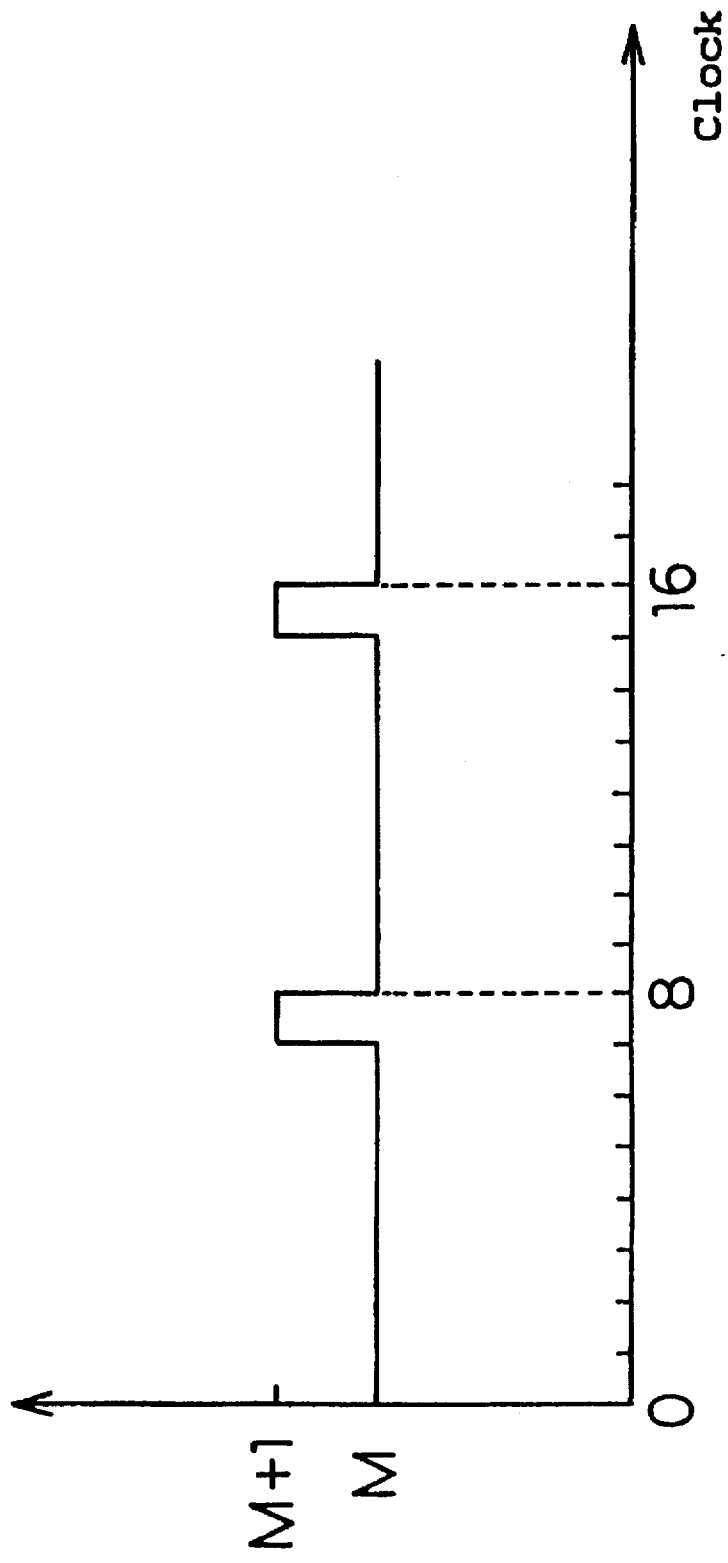
FIG. 3 is a timing chart showing an example of change of division value of an RF divider of the frequency synthesizer in the first embodiment.

The accumulator 101 is composed of the adder 102 and register 103. The adder 102 adds the input n-bit data K and the output of the register 103, and outputs the result to the register 103. The register 103 updates the output at every clock. The adder 102 overflows when the result of addition exceeds L=2$^n$, and generates a carry signal. The integer part adder 104 outputs M when the input data M has no carry signal, and (M+1) if having carry signal. Therefore, in the period of L locks, the division value is (M+1) in K times, and M in (L−K) times, and the average in this period is (M+K/L). By defining the value of K in an integer value from 0 to (L−1), the division value can be made in 1/L step. FIG. 3 shows the change of division value in the case of n=3, L=8, and K=1. In FIG. 3, M occurs 7 times in the period of 8 clocks, and (M+1) once, and the average is ⅛. In this way, the fractional division controller 8 produces the division value in a fractional value as the mean value by periodically changing the data of integer value. The synchronizer 105 synchronizes the changing timing of the select signal entering from outside with the clock. The data selector 10 selects either one of the outputs of the fractional division controller 8 and integer division controller 9 depending on the output of the synchronizer 105. The output of the synchronizer 105 controls the switch 109 when the output of the integer division controller 9 is selected, and stops the clock of the accumulator 101.

Herein, the division values of the reference divider 3 and RF divider 2 delivered by the integer division controller 9 are L times of the division value of the reference divider 3 and the average division value of the RF divider 2 delivered by the fractional division controller 8. The output signal frequency of the VCO 1 is expressed by the product of the phase comparison frequency of the phase/frequency comparator 4 and the division value of the RF divider 2, and therefore the center frequency of the output signal of the VCO 1 may be equal whether the output of the fractional division controller 8 or the output of the integer division controller 9 is used.

When changing over the output signal frequency of the VCO 1, first the data selector 10 selects the output of the fractional division controller 8 by the select signal, and performs fractional division operation. At the timing when the output signal frequency is nearly changed over, it is switched to the output of the integer division controller 9, and integer division operation is conducted. In the fractional division operation, as compared with the integer division operation, the phase comparison frequency of the phase/frequency comparator 4 is L times, so that the frequency can be changed over at high speed. Switching is followed by integer division operation with constant division value, so that the spurious signal is small.

Thus, according to the embodiment, the fractional division operation and integer division operation can be changed over. Since the fractional division operation and integer division operation are synchronized with the clock, error does not occur in switching operation. When changing over the frequency, first the fractional division operation of high phase comparison frequency is done, which is followed by the integer division operation, and hence the frequency can be switched fast and the characteristic of low spurious signal in output signal is realized. Besides, in the integer division operation, since the clock of the fractional division controller is stopped, there is no current consumption.

Figure 4:
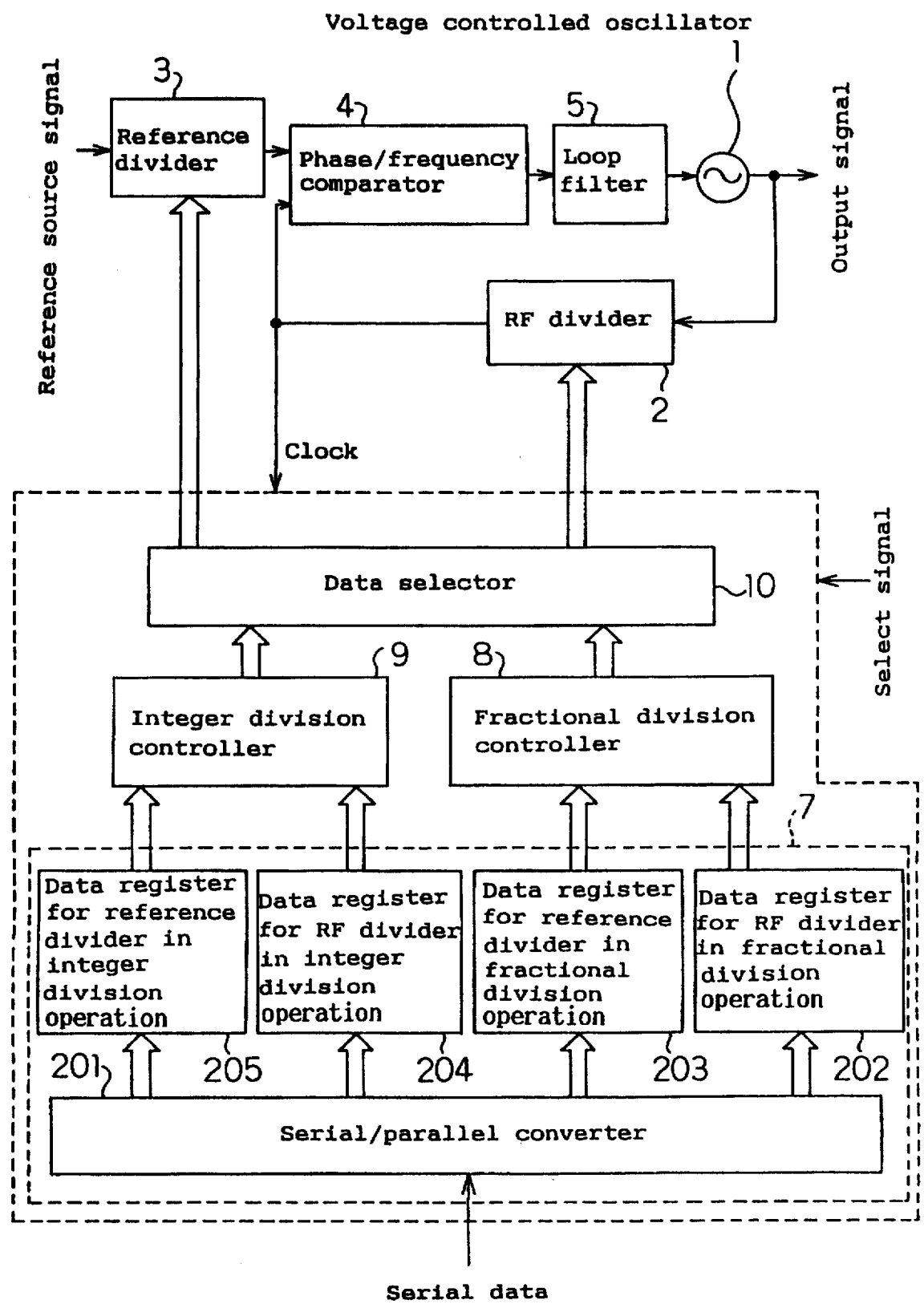
FIG. 4 is a structural diagram of a frequency synthesizer in a second embodiment of the invention.

A frequency synthesizer according to a second embodiment of the invention is described below by referring to the drawing. FIG. 4 is a structural diagram of the frequency synthesizer of the second embodiment of the invention. The basic constitution in FIG. 4 is same as in FIG. 1, except that only the constitution of the data converter is different, and same parts as in FIG. 1 are identified with same reference numerals and duplicate explanations are omitted. In FIG. 4, reference numeral 201 is a serial-parallel converter, 202 is a data register for RF divider in fractional division operation, 203 is a data register for reference divider in fractional division operation, 204 is a data register for RF divider in integer division operation, and 205 is a data register for reference divider in integer division operation.

In FIG. 4, the serial data entering from outside is converted into parallel data in the serial-parallel converter 201. The data contains address information, and depending on this value, it is stored in any one of the data register for RF divider in fractional division operation 202, data register for reference divider in fractional division operation 203, data register for RF divider in integer division operation 204, and data register for reference divider in integer division operation 205. The outputs of the data register for RF divider in fractional division operation 202 and data register for reference divider in fractional division operation 203 are fed into the fractional division controller 8, and the outputs of the data register for RF divider in integer division operation 204 and data register for reference divider in integer division operation 205 are fed into the integer division controller 9.

The fractional division controller 8 periodically changes the division value of the integer to the RF divider 2, and outputs the division value of fractional value as the average, and performs fractional division operation. The integer division controller 9 directly outputs the division value of the input integer value, and performs integer division operation. Either output of the fractional division controller 8 or integer division controller 9 is selected by the data selector 10 depending on the select signal, and the division values of the RF divider 2 and reference divider 3 are controlled.

The division values of the reference divider 3 and RF divider 2 delivered by the integer division controller 9 are $L=2^n$ times the division value of the reference divider 3 and the average division value of the RF divider 2 delivered by the fractional division controller 8, respectively. The value of n varies by changing the input data. The output signal frequency of the VCO 1 is expressed by the product of the phase comparison frequency of the phase/frequency comparator 4 and division value of the RF divider 2, and therefore the center frequency of the output signal of the VCO 1 is equal whether the output of the fractional division controller 8 or the integer division controller 9 is used.

When changing over the output signal frequency of the VCO 1, first the data selector 10 selects the output of the fractional division controller 8 by the select signal, and performs fractional division operation. Then, at the timing when the output signal frequency is nearly changed over, it is changed over to the output of the integer division controller 9 to perform integer division operation. In the fractional division operation, as compared with the integer division operation, the phase comparison frequency of the phase/frequency comparator 4 is L times, so that the frequency can be changed over at high speed. Switching is followed by integer division operation with constant division value, so that the spurious signal is small.

Thus, according to the embodiment, when changing over the frequency, first the fractional division operation of high phase comparison frequency is done, which is followed by the integer division operation, and hence the frequency can be switched fast and the characteristic of low spurious signal in output signal is realized. Since the data can be set independently in the fractional division operation and integer division operation, the ratio of the phase comparison frequency of fractional division operation and integer division operation can be set freely in the cumulative unit of 2.

Figure 5:
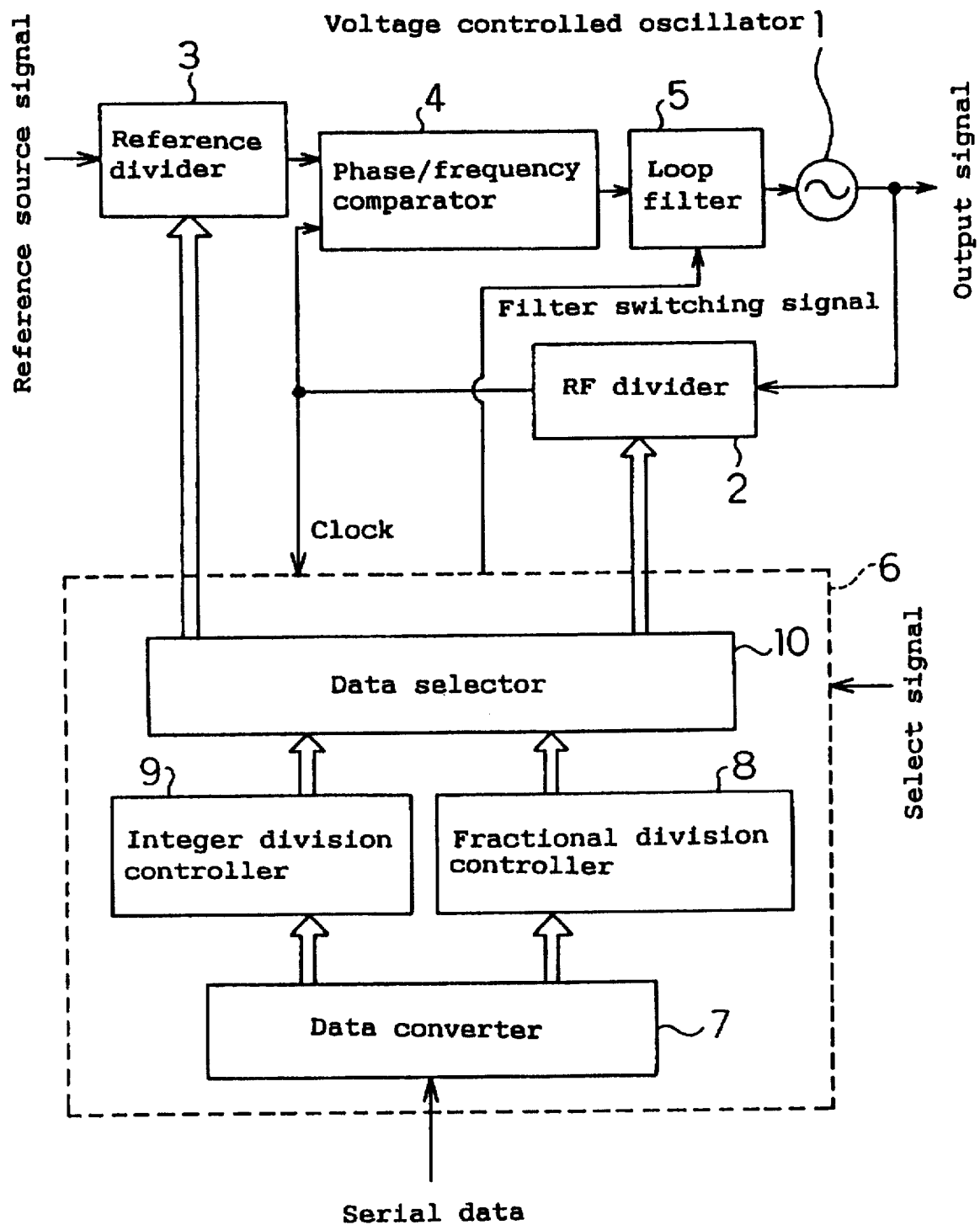
FIG. 5 is a structural diagram of a frequency synthesizer in a third embodiment of the invention.

A frequency synthesizer according to a third embodiment of the invention is described below by referring to the drawings. FIG. 5 is a structural diagram of the frequency synthesizer of the second embodiment of the invention. The basic constitution in FIG. 5 is same as in FIG. 1, except that only the constitution of the phase/frequency comparator 4 and loop filter 5 is different, and same parts as in FIG. 1 are identified with same reference numerals and duplicate explanations are omitted. Besides, the constitution of the division value control circuit 6 in FIG. 5 is same as shown in FIG. 2.

Figure 6:
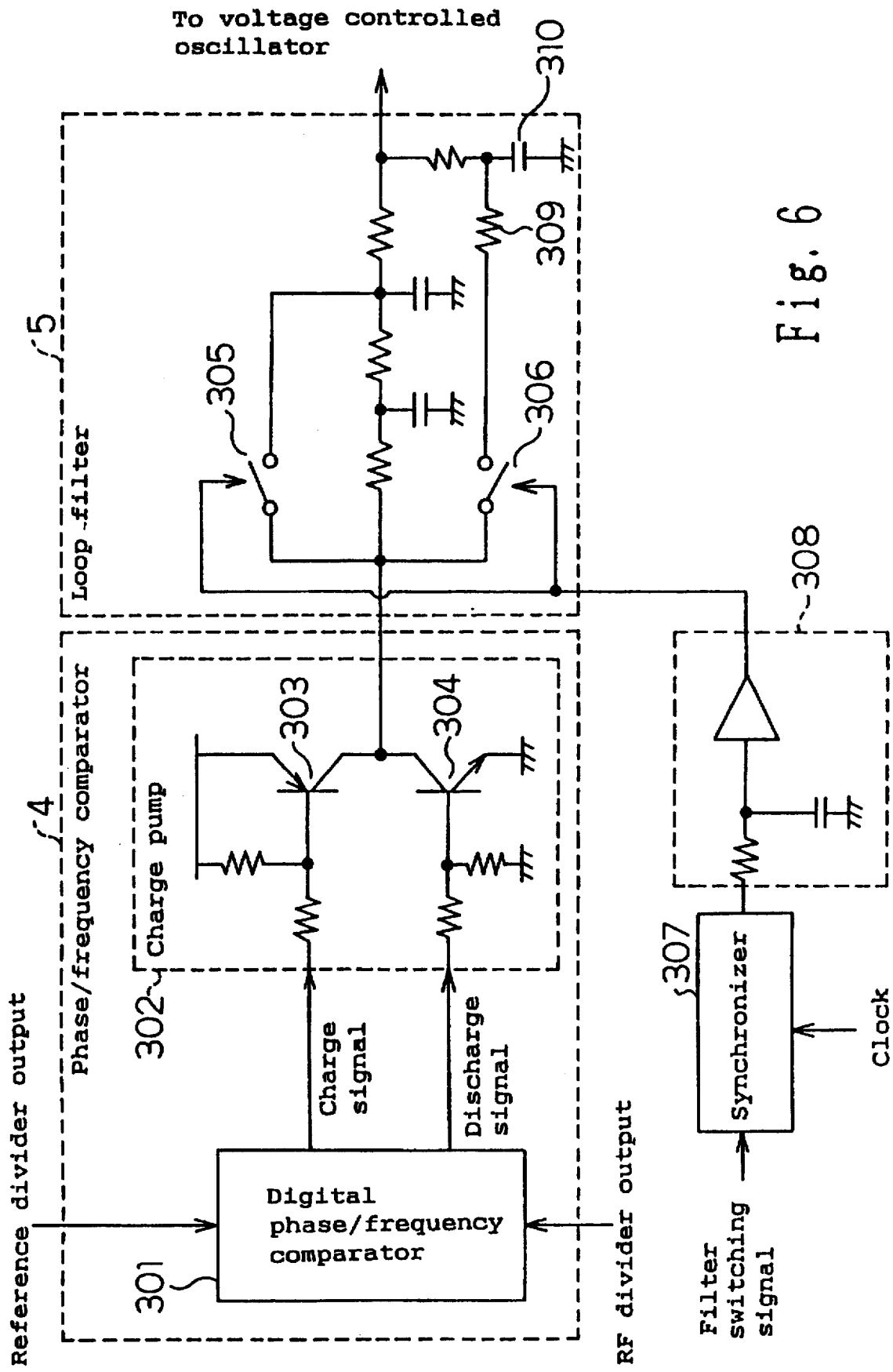
FIG. 6 is a structural diagram of a phase/frequency comparator and a loop filter of the frequency synthesizer in the third embodiment.

FIG. 6 is a structural diagram of the phase/frequency comparator and loop filter of the embodiment. In FIG. 6, reference numeral 301 is a digital phase/frequency comparator, and 302 is a charge pump. The phase/frequency comparator 4 comprises the digital phase/frequency comparator 301 and charge pump 302.

The digital phase/frequency comparator 301 detects a phase error of the reference divider output and RF divider output, and sends a pulse charge signal or discharge signal into the charge pump 302. The charge pump 302 is composed of PNP transistor 302 and NPN transistor 303 having their collectors connected with each other. The output signals from the collectors of the PNP transistor 302 and NPN transistor 303 are fed into the loop filter 5.

The loop filter 5 is a passive filter composed of resistance and capacitor, and comprises a switch 305 for connecting the input end and a point in the inside, and a switch 306 for connecting the input end and a capacitor 310 largest in the capacitance of the inside through a resistance 309. The loop filter 5 is wide in the pass bandwidth when the switch 305 and switch 306 are ON, and narrow in the pass bandwidth when the switch 305 and the switch 306 are OFF. The filter switching signal controls the switch 305 and switch 306 through a synchronizer 307 and a delay circuit 308. The synchronizer 307 synchronizes the change of select signal with the clock, and the delay circuit 308 delays the signal by the loop filter composed of resistance and capacitor and the amplifier.

Figure 8:
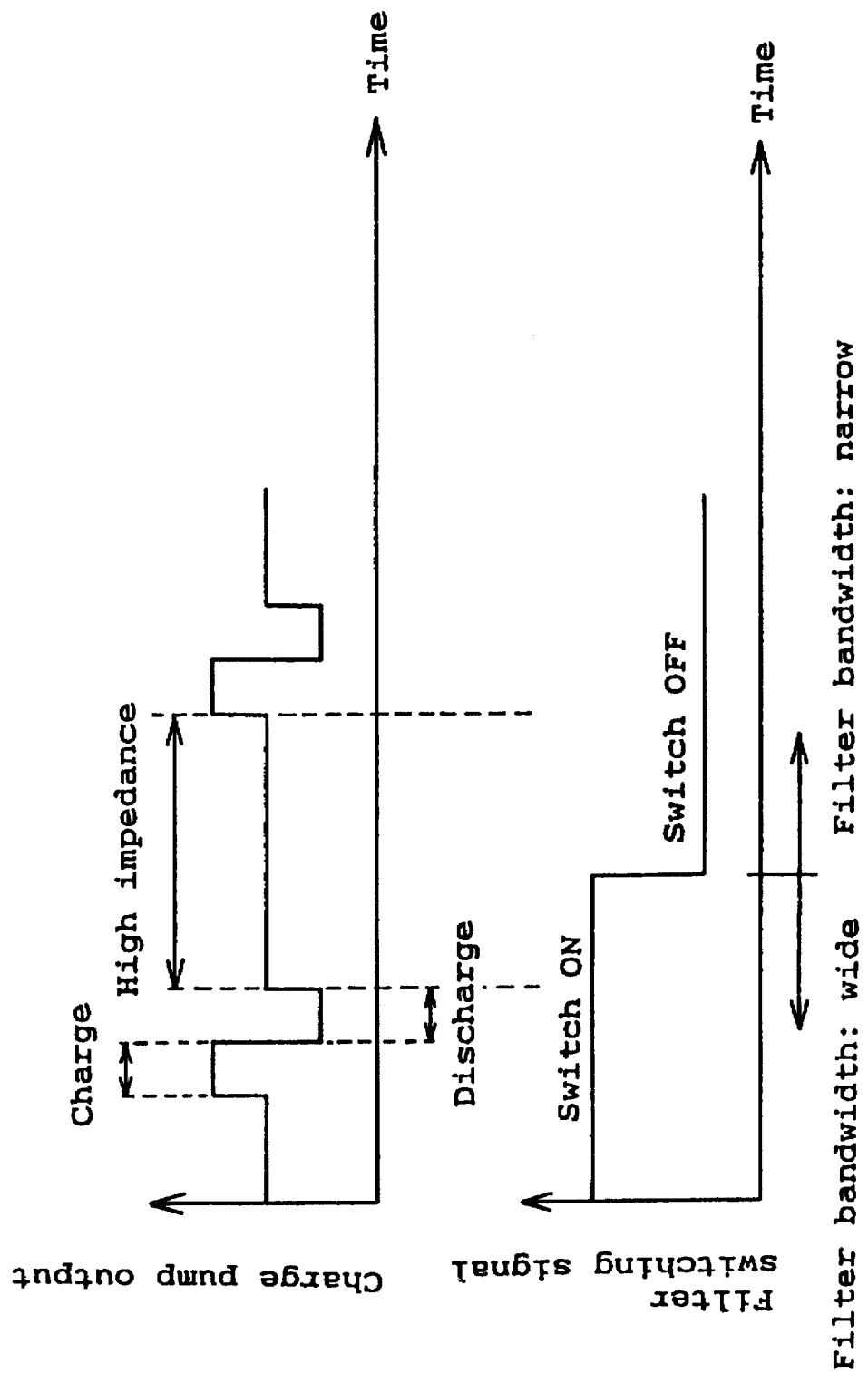
FIG. 8 is a detailed timing chart of charge pump output and filter switching signal of the frequency synthesizer in the third embodiment.

In this constitution, when changing over the output signal frequency of the VCO 1, the filter switching signal and select signal are changed at the timing shown in FIG. 7. First, the data selector 10 selects the output of the fractional division controller 8 by the select signal, and performs fractional division operation. The loop filter 5 is extended in the pass bandwidth as the switch 305 and switch 306 are turned on by the filter switching signal. When the frequency is nearly changed over, the switch 305 and switch 306 are turned off by the filter switching signal, and the pass bandwidth of the loop filter 5 is narrowed. Afterwards, the data selector 10 selects the output of the integer division controller 9 by the select signal, and performs integer division operation. FIG. 8 is a detailed diagram of the timing of turning off the switch 305 and switch 306 by the filter switching signal. While the output of the charge pump is in high impedance state by the synchronizer 307 and delay circuit 308, the filter switching signal turns off the switch 305 and switch 306.

In this embodiment, thus, when changing over the frequency, fractional division operation is performed, and the pass bandwidth of the loop filter 5 is widened at the same time. The phase comparison frequency is high and the pass bandwidth of the loop filter 5 is broad, so that the frequency can be changed over extremely at high speed. When the frequency is nearly changed, the pass bandwidth of the loop filter 5 is narrowed, and then integer division operation is performed to change the pass bandwidth of the loop filter 5, and therefore the fluctuation is small and the convergence after switching is quick. In integer division operation, the division value is constant, and hence spurious signal of output signal is small.

Figure 9:
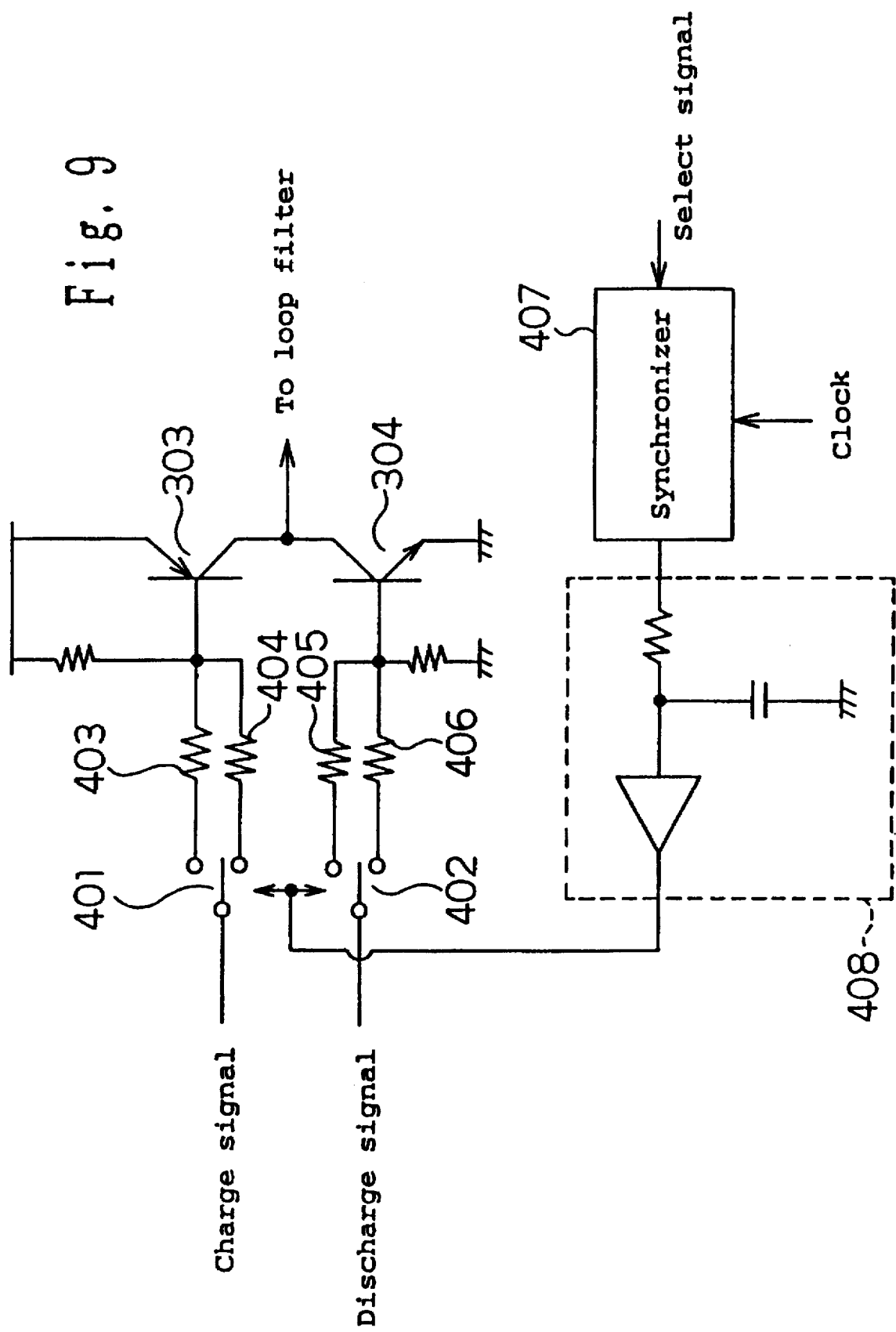
FIG. 9 is a diagram showing other structural example of charge pump of the frequency synthesizer in the third embodiment.

By constructing the charge pump in FIG. 6 as shown in FIG. 9, switching of output signal frequency may be made much faster. In FIG. 9, in the fractional division operation, the charge signal is fed into the base of the PNP transistor 303 through the resistance 403 selected by the switch 401. The discharge signal is fed into the base of the NPN transistor 304 through the resistance 405 selected by the switch 402. In the integer division operation, the switch 401 selects the resistance 404, and the switch 402 selects the resistance 406. The resistance value of the resistance 403 is smaller than that of the resistance 404, and the resistance value of the resistance 405 is smaller than that of the resistance 406. The switch 401 and switch 402 are controlled by the select signal through the synchronizer 407 and delay circuit 8. The synchronizer 407 synchronizes the change of select signal with the clock, and the delay circuit 408 delays the signal by the loop filter composed of resistance and capacitor and the amplifier. In the fractional division operation, since the base resistance of each transistor is small, the charging and discharging current of the charge pump is large, and the output frequency is changed over faster.

Figure 10:
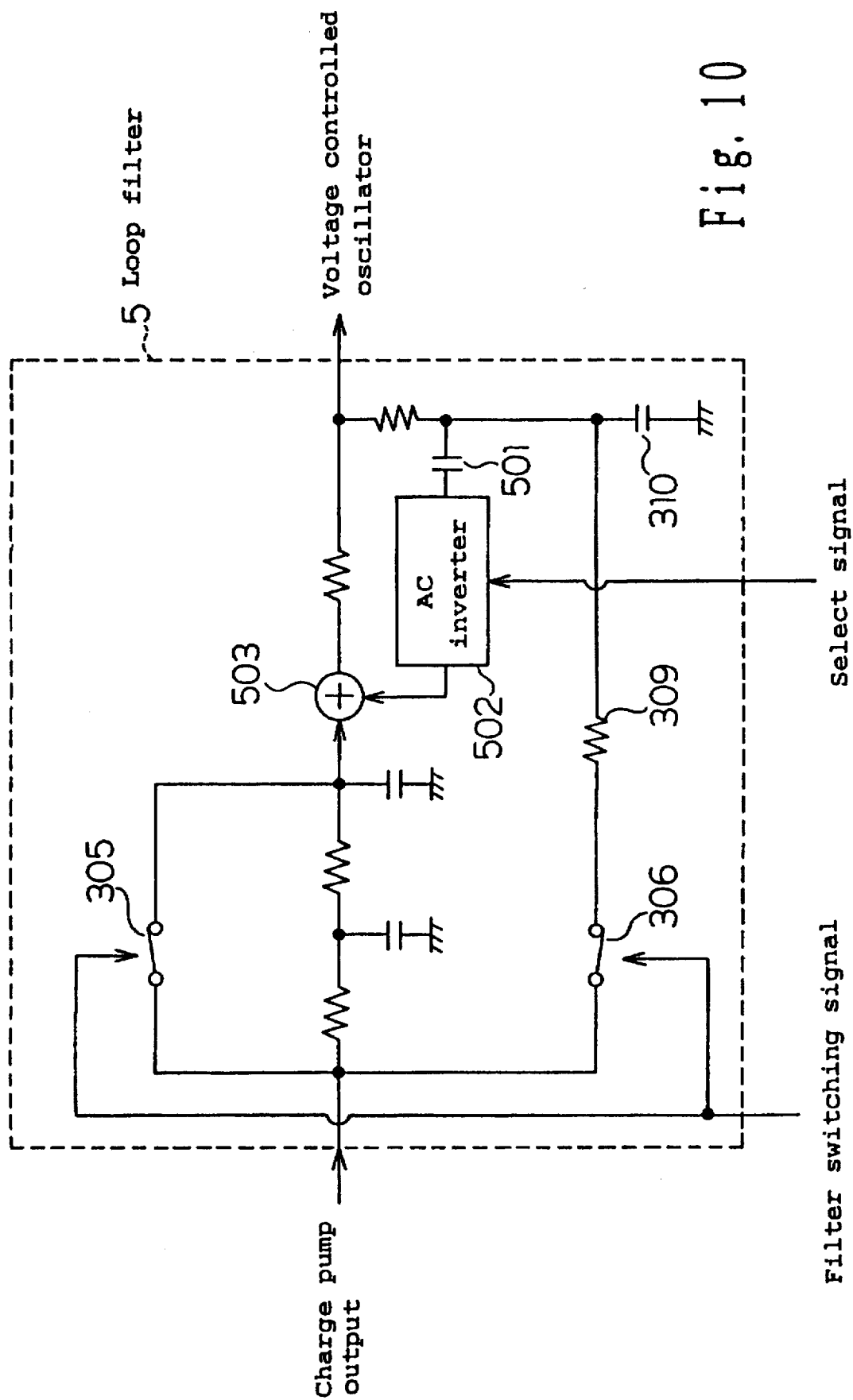
FIG. 10 is a diagram showing other structural example of loop filter of the frequency synthesizer in the third embodiment.
Figure 11:
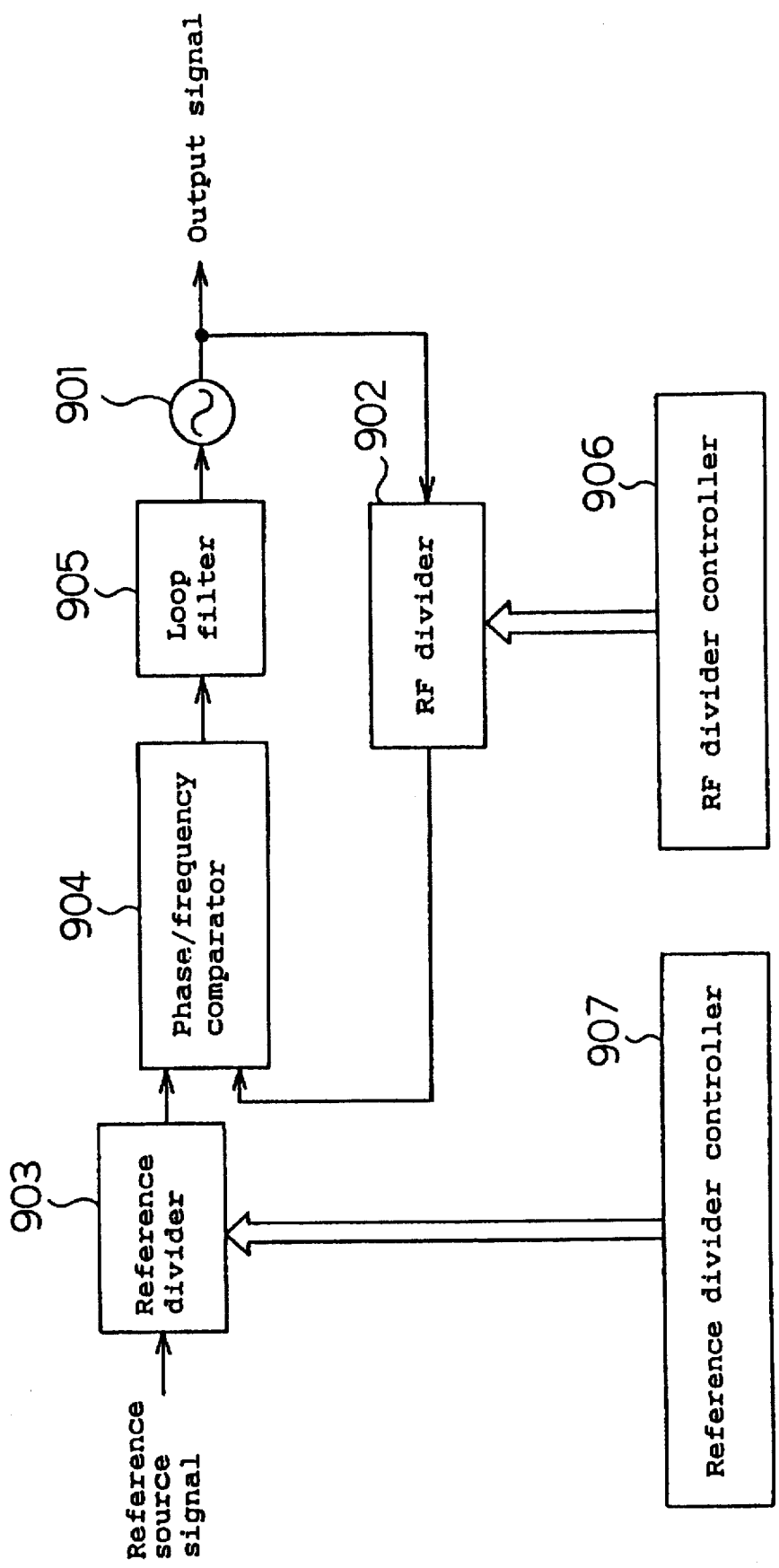
FIG. 11 is a structural diagram of a conventional frequency synthesizer.

FIG. 10 is a diagram showing other structural example of the loop filter 5 in FIG. 6. This loop filter is composed by adding a capacitor 501, an AC inverter 502, and a voltage adder 503 to the loop filter in FIG. 6. The AC inverter 502 detects the voltage fluctuation applied to the capacitor 310 through the capacitor 501, and adds an inverted signal to the loop filter 5 through the voltage adder 503. The AC inverter 502 stops its operation when the select signal specifies integer division operation. In fractional division operation, the voltage of parts in the loop filter also fluctuates largely in period depending on the change of division value of the RF divider 2. This fluctuation is canceled by generating and adding an inverted signal of periodic voltage fluctuations by the AC inverter 502. Accordingly, the fluctuations are smaller when changed over to the integer division operation, and the subsequent convergence is quick.

Incidentally, the phase/frequency comparator 4 and loop filter 5 shown in this embodiment may be also applied in the frequency synthesizer shown in FIG. 4.

Thus, when changing over the output signal frequency, the division value of the reference divider 3 is set small and the division value of the RF divider 2 is also set small to perform fractional division operation for changing periodically, and it is followed by the integer division operation in which the division values of the reference divider 3 and RF divider 2 are large and constant integer values, and therefore the output signal frequency can be changed over at high speed because the phase comparison frequency is high. After switching the output signal frequency, since the division value of the RF divider 2 is not changed, the fluctuations of control voltage of the VCO 1 may be extremely small, so that the spurious signal of output signal may be very small.

As the invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A frequency synthesizer comprising:
   a reference divider for dividing a reference source signal;
   a voltage controlled oscillator;
   an RF divider for dividing the output signal of the voltage controlled oscillator;
   a phase/frequency comparator for comparing the phases of the output signal of the RF divider and the output signal of the reference divider;
   a loop filter for outputting a detected phase error as a control voltage of the voltage controlled oscillator; and
   a division value controller for making the RF divider perform fractional division operation when the output signal frequency of the voltage controlled oscillator is changed, and for making the RF divider perform integer division operation after the change of the output signal frequency is substantially completed, and determining the division value of the reference divider as the division value corresponding to said integer division operation.

2. A frequency synthesizer according to claim 1, wherein the division value controller comprises a data converter, a fractional division controller, an integer division controller, and a data selector,
   the data converter converts serial data entering from outside into parallel data and outputs into the fractional division controller or integer division controller,
   the fractional division controller outputs an integer value to the RF divider, said integer value changes periodically so that an average of the outputs may be a fractional value,
   the integer division controller outputs an integer value to the RF divider,
   a ratio of the average division value of the RF divider delivered by the fractional division controller to the division value of the reference divider is equal to a ratio of the division value of the RF divider delivered by the integer division controller to the division value of the reference divider,
   the division value of the reference divider delivered by the integer division controller is larger than the division value of the reference divider delivered by the fractional division controller, and
   when changing over the output signal frequency of the voltage controlled oscillator, the data selector selects the output of the fractional division controller by a select signal, changes a state of the operation of the data selector to a state of said fractional division operation, and then selects the output of the integer division controller by a select signal, changes said state of said fractional division operation to a state of said integer division operation.

3. A frequency synthesizer according to claim 2, wherein the fractional division controller operates by using the output signal of the RF divider as the clock.

4. A frequency synthesizer according to claim 2, wherein the fractional division controller comprises an accumulator composed of an adder and a register,
   the adder adds the portion less than 1 of the division value of the fraction and the output of the register, and feeds the sum to the register, and only when the accumulator over flows, 1 is added to the division value of the RF divider, thereby changing the division value periodically.

5. A frequency synthesizer according to claim 2, wherein the clock of the fractional division controller is stopped when the data selector selects the integer division controller.

6. A frequency synthesizer according to claim 2, further comprising a synthesizer for synthesizing the change of the select signal with the output signal of the RF divider.

7. A frequency synthesizer according to claim 1, wherein when changing the output signal frequency of the voltage controlled oscillator, a pass bandwidth of the loop filter is widened in the state of said fractional division operation, and a pass bandwidth of the loop filter is narrowed after the change of output signal frequency is substantially over, thereafter changing to the integer division operation.

8. A frequency synthesizer according to claim 1, wherein the phase/frequency comparator comprises a digital phase/frequency comparator and a charge pump, and the output of the charge pump is set in any one of charge, discharge, and high impedance states to the loop filter.

9. A frequency synthesizer according to claim 8, wherein the pass bandwidth of the loop filter is narrowed while the charge pump output is in high impedance state.

10. A frequency synthesizer according to claim 9, wherein charging and discharging current of the charge pump output is larger in the fractional division operation than in the integer division operation.

11. A frequency synthesizer according to claim 10, wherein the charge pump is composed PNP transistor and NPN transistor having the mutual collectors connected with each other, and the charging and discharging current is increased by setting the resistance value for connecting each base and the output of the digital phase/frequency comparator smaller in the state of the fractional division operation than in the state of the integer division operation.

12. A frequency synthesizer according to claim 1, further comprising an AC inverter for detecting an AC component of the voltage at a point in the loop filter in the state of the fractional division operation, and inverting the detected signal to add to other point in the loop filter.

13. A frequency synthesizer according to claim 12, wherein the AC inverter does not work in the state of the integer division operation.

14. A frequency synthesizer according to claim 2, wherein the division value of the reference divider in the state of the integer division operation is $2^n$ times (n being an integer) of the division value of the reference divider in the state of the fractional division operation, the data converter converts the serial data entering from outside into parallel data and stores into the data register for reference divider and the data register for RF divider, the value of the data register for reference divider is the division value of the reference divider in the state of the integer division operation, and the data of upper bits excluding lower n bits is the division value of the reference divider in the state of the fractional division operation, the value of the data register for RF divider is the division value of the RF divider in the state of the integer division operation, and the lower n bits are the data corresponding to the value below the decimal point of the average division value in the state of the fractional division operation, and the data of upper bits excluding lower n bits is the data of the integer part of the average division value.

15. A frequency synthesizer according to claim 2, wherein the data converter converts the serial data entering from outside into parallel data, and stores the division value data of the reference divider and RF divider in the state of the integer division operation and in the state of the fractional division operation into individual data registers.

16. A frequency synthesizer according to claim 3, wherein the fractional division controller comprises an accumulator composed of an adder and a register, the adder adds the portion less than 1 of the division value of the fraction and the output of the register, and feeds the sum to the register, and only when the accumulator over flows, 1 is added to the division value of the RF divider, thereby changing the division value periodically.

* * * * *